United States Patent

Ban

[11] Patent Number: 6,167,481
[45] Date of Patent: Dec. 26, 2000

[54] ADDRESS GENERATING CIRCUIT FOR DATA COMPRESSION

[75] Inventor: Koji Ban, Tokyo, Japan

[73] Assignee: Ando Electric Co., Ltd, Tokyo, Japan

[21] Appl. No.: 09/178,948

[22] Filed: Oct. 26, 1998

[30] Foreign Application Priority Data

Oct. 29, 1997 [JP] Japan ................................. 9-297395

[51] Int. Cl.[7] ................................................. G06F 12/00
[52] U.S. Cl. .............................. 711/1; 382/232; 382/233
[58] Field of Search ........................ 711/1; 382/232–251; 345/429, 435, 501; 712/7

[56] References Cited

U.S. PATENT DOCUMENTS

| 5,226,135 | 7/1993 | Mishina et al. | 712/7 |
| 5,485,557 | 1/1996 | Sato et al. | 345/429 |
| 5,812,146 | 9/1998 | Sato et al. | 345/501 |
| 5,861,892 | 1/1999 | Sato et al. | 345/435 |

*Primary Examiner*—Bijan Tadayon
*Assistant Examiner*—Nasser Moazzami
*Attorney, Agent, or Firm*—Flynn, Thiel, Boutell & Tanis, P.C.

[57] ABSTRACT

It is an object of the invention to provide an address generating circuit for data compression capable of generating addresses in accordance with address compression blocks from any address in a failure analysis memory by executing an operation of the compression rate to an address compression block end by a CPU based on a start address position and an address compression rate. At an address generation starting time, a start address data b is held by a flip flop 3B and it is loaded at the same time into an up counter 5B as an output of a selector 4B, so that address generating operation is performed by a single clock. It is possible to generate addresses in accordance with the width of the address compression rate 2h in the address compression blocks for partitioning memory areas of an analysis memory by providing a selector 7B for selecting the address compression rate 2h when the address carry signal is outputted while data of an address compression rate 1g serves as a load data of a down counter 9B at the time of starting generation of addresses in case that an external address generating control circuit calculates the address compression rate 1g based on the start address data b and address compression rate 2h.

3 Claims, 4 Drawing Sheets

ADDRESS GENERATING CIRCUIT FOR DATA COMPRESSION

BACKGROUND OF THE INVENTION

1. Field of the Invention

The invention relates to an address generating circuit for data compression for fetching data stored in a failure analysis memory to a CPU at high speed and an arbitrary compression rate.

2. Prior Art

A multi-function and high speed of a failure analysis of a memory tester have been recently required as a memory device has a large capacity. As a hardware to meet the requirement, there is employed an address generating circuit for data compression data for fetching data stored in a failure analysis memory to a CPU at high speed and an arbitrary compression rate.

As a conventional address generating circuit for data compression, there is illustrated, for example in FIG. 3, wherein increment addresses are generated to reduce processing time for fetching data stored in a failure analysis memory to a CPU.

In the address generating circuit 1 for data compression shown in FIG. 3, a comparator 1A compares an end address data or signal a which is inputted from an external device to an input terminal A thereof with an address data I which is generated in an up counter 4A and inputted to an input terminal B thereof, wherein the comparator 1A outputs an address end signal k if the address data I is greater than the end address data a.

The selector 2A alternatively selects a start address data b which is inputted thereto an external device, and an addition data which is calculated by an adder 6A and inputted thereto in response to an address load cell signal c which is inputted thereto from an external device, and it outputs the selected data to the flip flop 3A. The flip flop 3A holds the inputted selected data at a timing of a clock signal which is generated by executing a logical AND operation between an address load enable signal d and a clock signal Ae which are respectively inputted to an AND gate 5A from the external device. The selected data held by the flip flop 3A becomes an input data of the up counter 4A, in which the input data is incremented by the up counter 4A to output the address data I.

In an adder 6A, an address compression signal h which is inputted thereto from the external device and the data outputted from the flip flop 3A are added, and the added data is outputted to the selector 2A. A down counter 7A receives the address compression signal h as input data and outputs an address carry signal m when the output data thereof is "1". Both the up counter 4A and the down counter 7A are controlled in counting operation by an address load signal i which is inputted thereto through a flip flop 10A and a clock enable signal j through a flip flop 11A.

That is, the address generating circuit 1 for data compression specifies an X coordinate as an X address and a Y coordinate as a Y address to generate address data for specifying to access to the failure analysis memory provided that the failure analysis memory includes memory areas which can be specified by addressed based on a two-dimensional coordinate system (X coordinate, Y coordinate). The address generating circuit 1 requires two address generating circuits for data compression having the same construction for specifying the X address and the Y address.

The operation of the address generating circuit 1 shown in FIG. 3 is explained with reference to FIG. 4. The X address generating circuit for data compression and the Y address generating circuit for data compression normally perform address generating operations relative to a blocks for an X address compression rate a and Y address compression rate b which are prepared by partitioning memory areas of a failure analysis memory shown in FIG. 4 (data in the block is compressed to form one bit compression data, hereinafter refereed to as address compression blocks). In the address compression blocks of FIG. 4, address data which are generated in the Y address generating circuit for data compression and the Y address generating circuit for data compression respectively generate addresses for incrementing the addresses in the direction of X while an X start address XB and a Y start address YB serve as a start address at the X address compression rate a and the Y address compression rate b.

That is, in the address generating circuit 1 for data compression shown in FIG. 3, the operation of generating the X start address is performed in the sequence of (1)→(2)→(3) . . . in the address compression blocks of FIG. 4, wherein the number of addresses to be incremented at the X address compression rates a and b is set.

However, there occurs a problem in the conventional address generating circuit 1 for data compression shown in FIG. 3 that a start address is not generated in accordance with inherent address compression blocks shown in FIG. 4 if the start address is generated from an arbitrary point of the address compression blocks, since the start address is always generated as a leading address in the address compression blocks.

That is, there occurs a problem that if the address is incremented from the X start address XB and the Y start address YB which are set at the position (1) to the position (2) at the same address compression rate a as shown in FIG. 4, the access position moves to the next address compression block, making it difficult to normally perform the operation for compressing and specifying the address in the address blocks which are repaired by partitioning the memory areas of the failure analysis memory since the number of addresses is incremented from the start address generated at an arbitrary point without changing the address compression rate.

Further, there also occurs another problem in the address generating circuit 1 for data compression shown in FIG. 3 that it can not be operated with a single clock since the flip flop 3A and the up counter 4A for holding the start address are connected to each other by a pipe line.

That is, since a clock for setting a timing of the holding operation of the flip flop 3A is a clock signal Ae, and a clock for setting a timing of the counting operation of the up counter 4A is a clock signal Bg, requiring two kind of clock signals, resulting in generation of a problem of applying a load in constructing the circuit.

SUMMARY OF THE INVENTION

The invention has been made in view of the aforementioned problems and it is an object of the invention to provide an address generating circuit for data compression capable of generating addresses in accordance with address compression blocks from any address in a failure analysis memory by executing an operation of the compression rate to an address compression block end by a CPU based on a start address position and an address compression rate.

The above object is achieved by the first aspect of the invention comprising an adder for executing addition between address compression rate signal and a load data, a selector for alternatively selecting an addition data outputted from the adder and a start address data, a register for holding the data selected by the selector, an up counter for generating an increment addresses while the data held by the register serves as a load data, a down counter for generating an address carry signal while the address compression rate signal serves as the load data, a comparator for comparing an end address with the addresses outputted from the up counter to detect a final address, wherein addresses in a memory are compressed to generate address data so as to transfer all data stored in the memory at an arbitrary compression rate, the address generating circuit further comprising an address compression rate selector for selecting an arbitrary address compression rate, wherein the address compression rate is selected by the address compression rate selector to set the start address to an optimum value, thereby starting the compression and transfer data from an arbitrary address in the memory.

As a result, according to the address generating circuit for data compression in the first aspect of the invention, data analysis can be executed from an arbitrary address when executing failure analysis of a memory device having a large capacity, thereby reducing a load applied on an application software for executing the failure analysis.

Still further, in this case, the above object can be achieved, for example, by the invention as set forth in a second aspect of the invention, wherein the address compression rate selected by the address compression selector is calculated from the start address which is arbitrarily set and the address compression rate which is previously set, thereby easily calculating the address compression rate.

Still further, in a third aspect of the invention, the address generating circuit for data compression of the first or second aspect of the invention further comprises a load selector provided at an input stage of the up counter for generating the increment addresses for alternatively selecting the data selected by the selector and the data held by the register in response to a given synchronous signal to load the selected data into the up counter. Accordingly, it is possible to render the circuit construction to be able to control respective operation timings by a single clock, thereby reducing the load applied to the circuit.

PREFERRED EMBODIMENTS OF THE INVENTION

Figure 1:
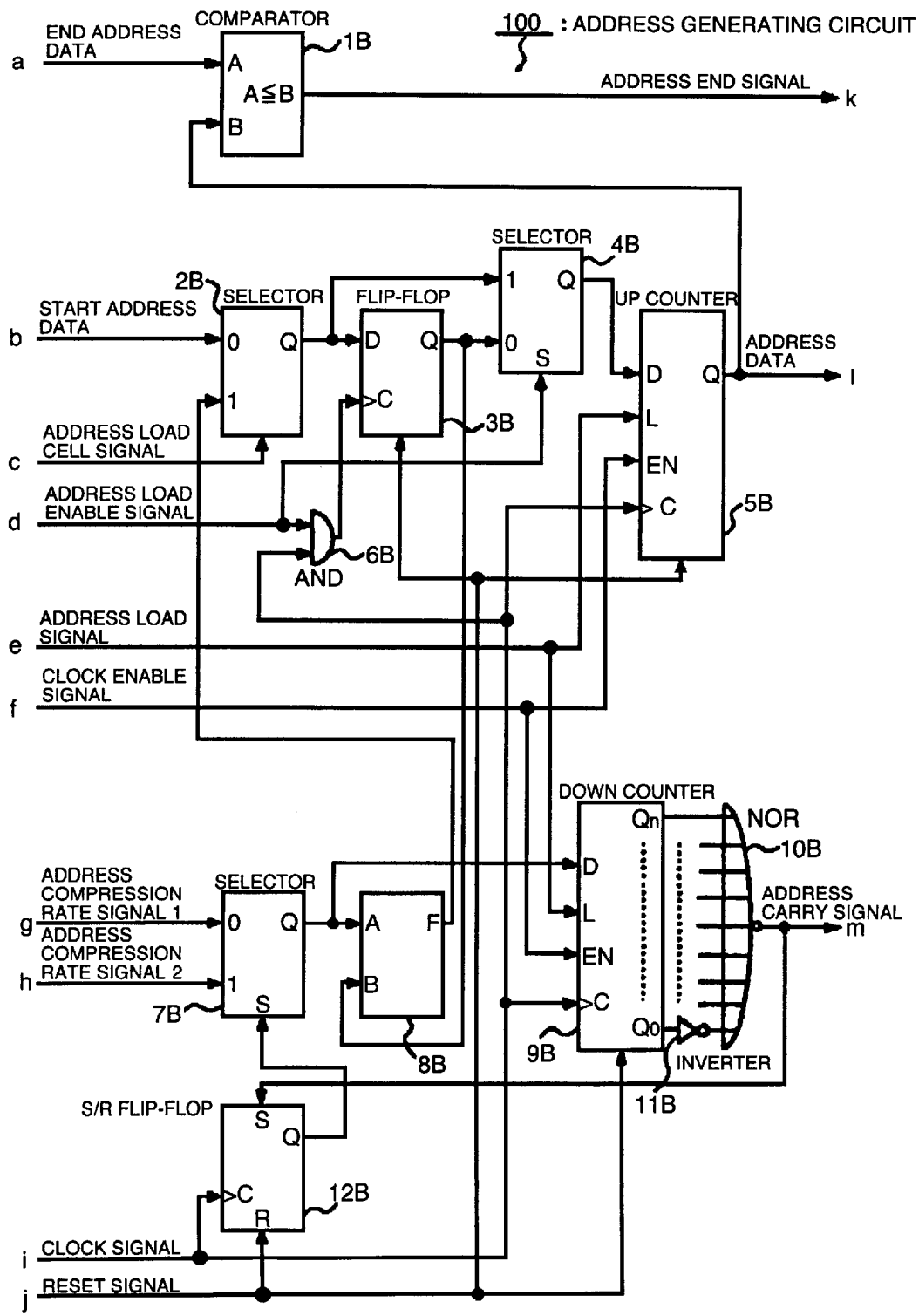
FIG. 1 is a diagram showing a circuit construction of an address generating circuit for data compression according to a preferred embodiment of the invention.
Figure 2:
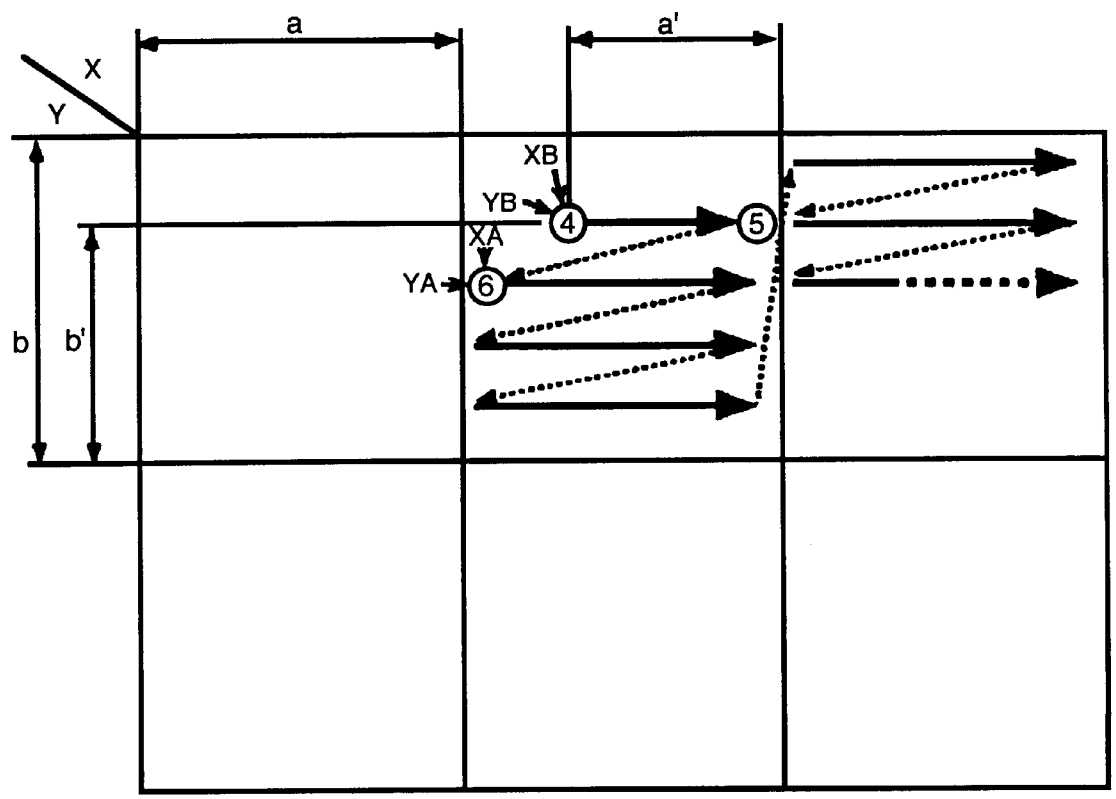
FIG. 2 is a view showing an address generating operation which is executed in a failure analysis memory by the address generating circuit for data compression of FIG. 1.
Figure 3:
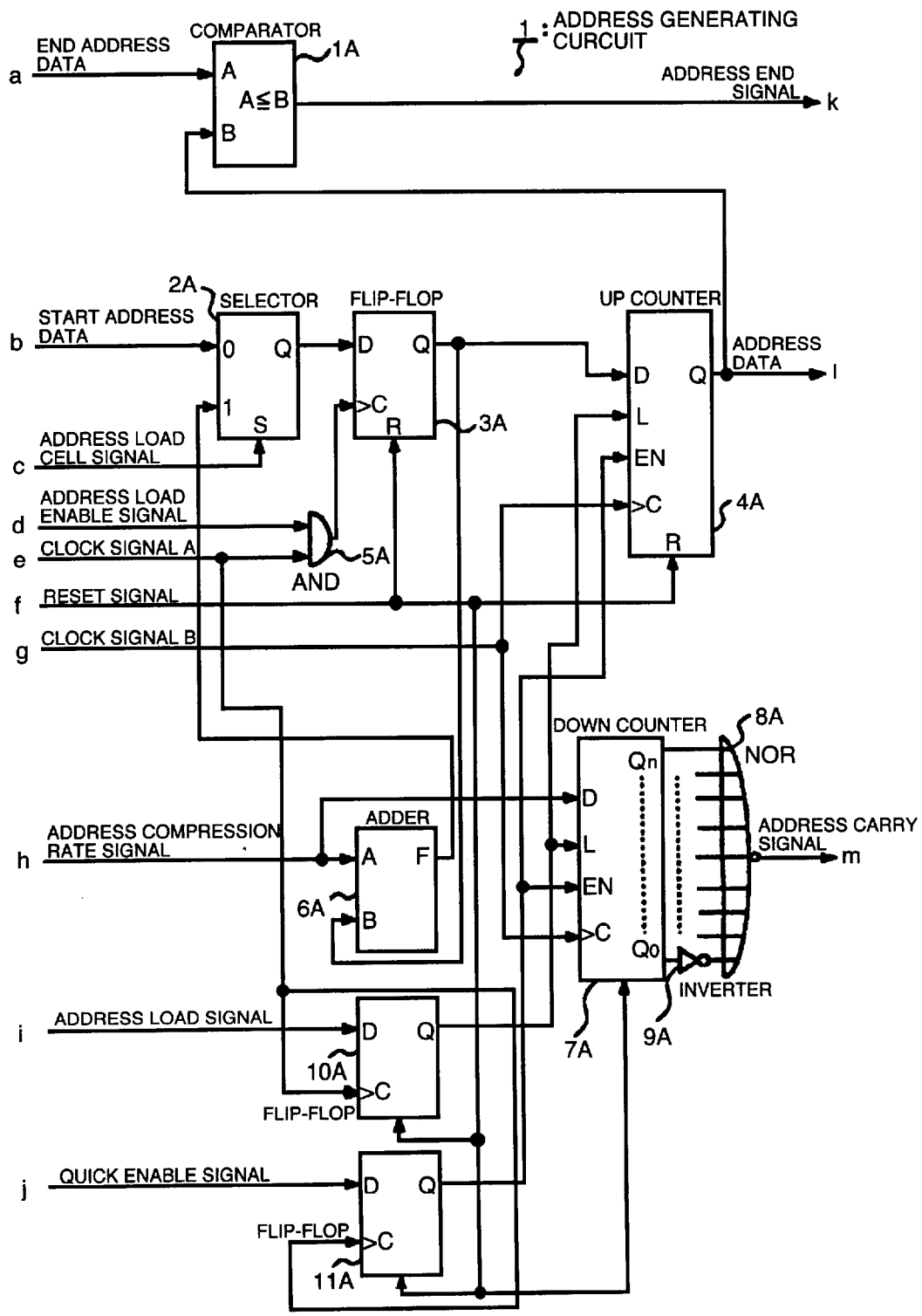
FIG. 3 is a block diagram of a circuit construction of a conventional address generating circuit for data compression.
Figure 4:
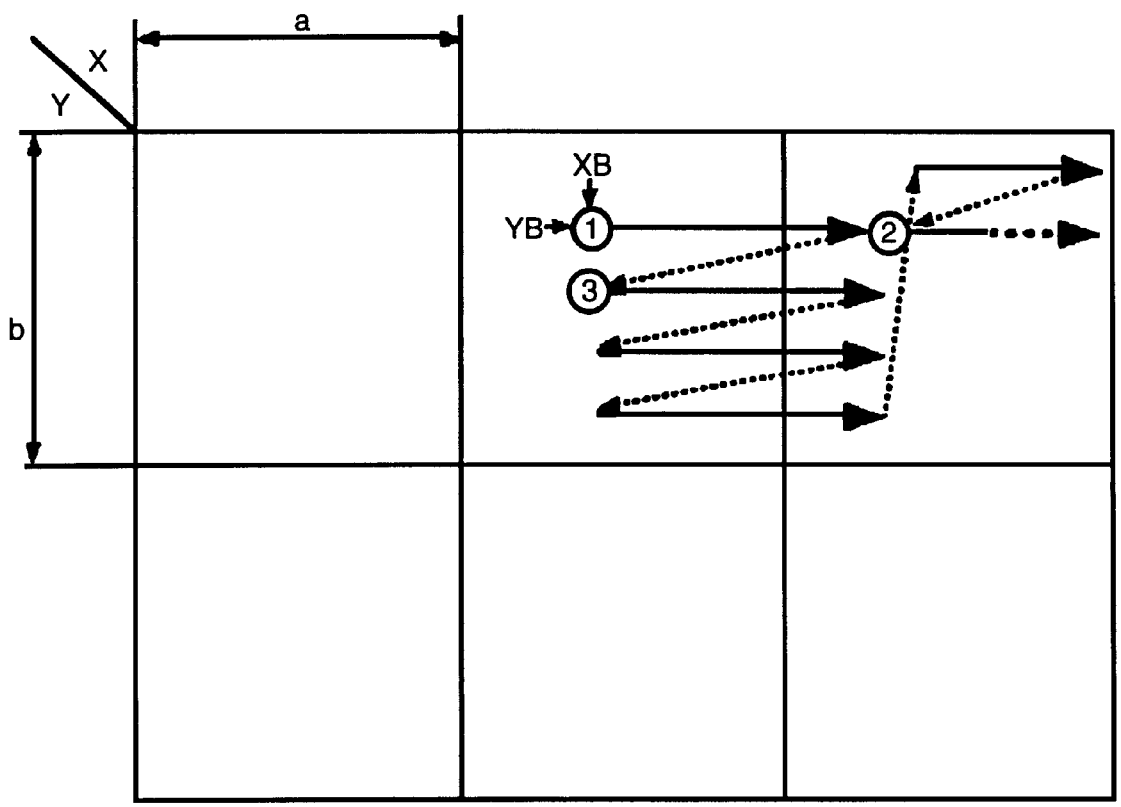
FIG. 4 is a view showing an address generating operation which is executed in a failure analysis memory by the address generating circuit for data compression of FIG. 3.

An address generating circuit for data compression according to a preferred embodiment of the invention will be now described in detail FIGS. 1 and 2 are views of the address generating circuit for data compression according to a preferred embodiment of the invention to which the invention is applied. The address generating circuit is utilized to generate addresses for data compression so as to fetch data stored in a failure analysis memory to a CPU at high speed and an arbitrary compression rate. The construction of the address generating circuit for data compression will be explained.

FIG. 1 is a circuit construction of an address generating circuit 100 according to the preferred embodiment of the invention. In FIG. 1, the address generating circuit 100 comprises a comparator 1B, selectors 2B, 4B and 7B, a flip flop (register) 3B, an up counter 5B, an AND gate 6B, an adder 8B, a down counter 9B, a NOR gate 10b, an inverter 11B and an S/R flip-flop 12B.

The comparator 1B compares an end address data a which is inputted to an input terminal A thereof from an external system control circuit (not shown) with an address data I which is inputted to an input terminal B from the up counter 5B, and outputs an address end signal k to an address generating control circuit (not shown) to be connected to an output stage.

The selector 2B alternatively selects a start address data b which is inputted thereto from an external address generating control circuit and an addition data which is inputted thereto from the adder 8B in response to an address load cell signal c which is inputted thereto from the external address generating control circuit, and it outputs the selected data or signal to the flip flop 3B and the selector 4B.

The flip flop 3B holds the selected data which is inputted thereto from the selector 2B in response to a timing signal which is inputted thereto from the AND gate 6B, and it outputs the held selected data to the selector 4B and the adder 8B.

The selector 4B alternatively selects the selected data which is inputted thereto from the selector 2B and the selected data which is inputted thereto from and held by the flip flop 3B in response to an address load enable signal d which is inputted thereto from the address generating control circuit, and it outputs the selected data to the up counter 5B.

The up counter 5B renders the selected data inputted thereto from the selector 4B to be input data thereof, increments the input data so as to output the address data I to the failure analysis memory which is connected to the output stage. That is, the selected data outputted from the selector 4B and inputted to the up counter 5B is either of the start address data b which is selected by the selector 2B or a signal which is generated by adding an address compression rate signal 1g or an address compression rate signal 2h to the input data which is inputted previously in the up counter 5B. The incrementing operation of the address in the up counter 5B is controlled by an address load signal e or a clock enable signal f which are respectively inputted thereto from the external address generating control circuit.

The AND gate 6B generates a timing signal which controls a holding timing of the flip flop 3B by executing the logical AND between the address load enable signal d inputted thereto from the external address generating control circuit and a clock signal i which is inputted thereto from a system control circuit, and it outputs the timing signal to the flip flop 3B.

The selector 7B alternatively selects the address compression rate signal 1g calculated and inputted thereto by the external address generating control circuit and the address compression rate signal 2h in response to a control signal which is inputted thereto from the S/R flip-flop 12B, and it outputs the selected address compression rate signal 1g or address compression rate signal 2h to the adder 8B and the down counter 9B.

The adder 8B adds the address compression rate signal 1g or the address compression rate signal 2h which is selected by and inputted thereto from the selector 7B and a selected data (start address) inputted thereto from the flip flop 3B, and it outputs the added data to the selector 2B.

The down counter 9B discriminates whether an output data thereof is "1" or not by the NOR gate 10b and the inverter 11B while the address compression rate signal 1g or the address compression rate signal 2h which is selected by and inputted thereto from the selector 7B serves as input data, then it outputs the address carry signal m to the external address generating control circuit and also to the SIR flip-flop 12B when the output data is "1". The operation of the down counter 9B is controlled by the address load signal e and the clock enable signal f which are inputted thereto from the external address generating control circuit like the up counter 5B.

The S/R flip-flop 12B holds the address carry signal m which is inputted thereto from the down counter 9B in response to the clock signal i and the reset signal j for controlling the operation timing in the system, and generates a control signal for controlling the selection operation of the selector 7B in response to the held address carry signal m, then it outputs the control signal to the selector 7B.

The operation of the address generating circuit 100 as shown in FIG. 1 will be now described with reference to FIG. 2 showing the address generating operation.

The address generating circuit 100 shown in FIG. 1 is considered to have two circuits one of which is for generating an X address and the other of which is for generating a Y address respectively for designating the X address and the Y address in the failure analysis memory.

Respective address generating operations in each of the address generating circuit 100 for generating the X and Y addresses are controlled by variety of control signals which are outputted from an external system control circuit and the external address generating control circuit, respectively not shown, wherein the control signal inputted thereto from the system control circuit comprises the end address data a, the clock signal i and the reset signal j respectively shown in FIG. 1, and the control signal outputted from the external address generating control circuit comprises the start address data b, the address load cell signal c, the address load enable signal d, the address load signal e, the clock enable signal f, and the address compression rate signals 1g and 2h.

The external address generating control circuit calculates an X address compression rate a' based on an X start address XB and an X address compression rate a which are respectively set in the address compression blocks partitioning the memory area in the failure analysis memory shown in FIG. 2, and also calculates an Y address compression rate b' based on an Y start address YB and an Y address compression rate b which are respectively set in the same address compression block, then it sets the calculated X address compression rate a' and Y address compression rate b' as the address compression rate signal 1g at the selector '7B of the address generating circuit 100 shown in FIG. 1.

The external address generating control circuit sets the X address compression rate a and the Y address compression rate b respectively shown in the compression blocks of FIG. 2 at the selector 7B of the address generating circuit 100 shown in FIG. 1.

In the address compression blocks of the failure analysis memory shown in FIG. 2, if the up counting of the X address started from the position denoted by (4), the external address generating control circuit respectively outputs the X start address XB and the Y start address YB at the position (4) as the start address data b to the address generating circuits 100 for X address and Y address. That is, in the selector 2B of the address generating circuit 100 shown in FIG. 1, if the X start address XB or the Y start address YB is outputted from the address generating control circuit as the start address data b, the X start address XB or the Y start address YB is selected and outputted to the flip flop 3B and the selector 4B.

In the flip flop 3B, the X start address XB and the Y start address YB which are selected and inputted thereto by the selector 2B are held depending on the state ("H" or "L") of the address load enable signal d which are inputted thereto from the address generating control circuit, and they are outputted to the selector 4B and the adder 8B. In the selector 4B, the X start address XB and Y start address YB which are inputted thereto from the selector 2B and the X start address XB and Y start address YB inputted thereto from the selector 2B among the X start address XB and the Y start address YB inputted thereto from the flip flop 3B, and the selected X start address XB and the Y start address YB are outputted to the up counter 5B as the input data of the up counter 5B.

In the up counter 5B, the increment operation of the up counter 5B is controlled depending on the state ("H" or "L") of the address load signal e and the clock enable signal f respectively inputted thereto from the address generating control circuit, so that the X start address XB and the Y start address YB which are inputted thereto from the selector 4B as the input data are respectively outputted to the failure analysis memory connected to the output stage as the address data I, and also to the comparator 1B. In the address compression blocks of the failure analysis memory shown in FIG. 2, the position (4) is specified as the start address for starting the data transfer from the address compression memory to a CPU (not shown) by the start addresses XB and YB respectively inputted thereto from the up counter 5B.

At this time, the X address compression rate a' which is calculated in the address generating control circuit is inputted thereto and selected by the selector 7B of the X address generating circuit 100 as the address compression rate signal 1g. This selection state remains from the time when the address carry signal m is outputted from the down counter 9B to the time when the control signal is inputted from the S/R flip-flop 12B. Accordingly, the X address compression rate a' is inputted to the selector 7B and the down counter 9B as input data. That is, the X start address XB of FIG. 2 is loaded into the up counter 5B of FIG. 1 and the X address compression rate a' of FIG. 2 is loaded into the down counter 9B of FIG. 1 at the position (4) of FIG. 2.

Further, the X address compression rate a' which is selected by the selector 7B is also inputted to the adder 8B in which X address compression rate a' is added to the X start address XB which is inputted thereto in advance from the flip flop 3B, and the added data is outputted to the selector 2B. In the selector 2B, if the added data outputted from the adder 8B is inputted thereto, the selection state of the start address data b (X start address XB) transfers to the selection state of the added data depending on the state of signal ("H" or "L") of the address load cell signal c, and the selected added data is outputted to the flip flop 3B and the selector 4B.

In the flip flop 3B, the added data which is selected by and inputted thereto from the selector 2B is held depending on the state of signal ("H" or "L") of the address load enable signal d which is inputted thereto from the address generating control circuit, then the added data is outputted to the selector 4B and the adder 8B. In the selector 4B, the added data which is inputted thereto from the flip flop 3B is selected among the added data outputted from the selector 2B and that outputted from the flip flop 3B, and the selected added data is outputted to the up counter 5B as the input data thereof.

In the up counter 5B, the increment operation thereof is controlled in the same manner as set forth above, wherein the added data which is inputted to the selector 4B as the input data is outputted to the failure analysis memory connected to the output stage as the address data I, then it is also outputted to the comparator 1B.

Accordingly, when the X start address XB inputted thereto from the external address generating control circuit is first loaded into the up counter 5B of the address generating circuit 100 for X address as the input data, the X start address XB is outputted to the failure analysis memory so that the up counting of the address is started from the position (4) in FIG. 2. If the X address compression rate a' outputted from the address generating control circuit is loaded into the up counter 5B of the address generating circuit 100 for X address as the input data, the address data I which is incremented by the X address compression rate a' is outputted to the failure analysis memory from the X start address XB and Y start address YB at the position (4) to the X direction, then the X address is incremented from the position (4) to a position denoted by (5).

If the X address is incremented at the position (5) in FIG. 2, although the X address compression rate a' which is inputted to the down counter 9B as the address compression rate signal 1g by the selection operation of the selector 7B is loaded into the down counter 9B of FIG. 1, the output data outputted from the output terminal of the down counter 9B is discriminated by the NOR gate 10b and the inverter 11B whether it is "1" or not. If the output data is "1", the X address carry signal m is outputted to the address generating control circuit and also to the S/R flip-flop 12B. That is, the number of addresses corresponding to the address compression rate signal 1g is down counted in the down counter 9B.

If the address carry signal m is inputted from the down counter 9B to the S/R flip-flop 12B, the control signal for controlling the selection operation of the selector 7B is generated in the SIR flip-flop 12B and it is outputted to the selector 7B. In the selector 7B, the selection state of the X address compression rate a' which is inputted thereto from the address generating control circuit as the address compression rate signal 1g transfers to the selection state for selecting the X address compression rate a which is inputted thereto from the address generating control circuit as the address compression rate signal 2h in response to the control signal outputted from the S/R flip-flop 12B. When the selection state of the selector 7B transfers to the X address compression rate a, the selected X address compression rate a is loaded into the down counter 9B as the input data.

Further, at this time, increment operation of the Y address is executed in the up counter 5B and the down counter 9B of the Y address generating circuit 100 based on the Y start address YB and the Y address compression rate b' which are respectively set in the address generating control circuit.

Subsequently, when start addresses XA and YA at the position denoted by (6) are calculated and inputted to the X and Y address generating circuits 100 from the address generating control circuit as the start address data b so as to move the address count position to the position (6) in FIG. 2, the start addresses XA and YA are selected and outputted to the flip flop 3B and the selector 4B.

In the flip flop 3B, the start addresses XA and YA which are selected by and inputted thereto from the selector 2B are held therein depending on the state of signal ("H" or "L") of the address load enable signal d which is inputted thereto from the external address generating control circuit, then they are outputted to the selector 4B and the adder 8B. The start addresses XA and YA which are inputted thereto from the selector 2B among the start addresses XA and YA which are inputted thereto form the selector 2B and those which are inputted thereto from the flip flop 3B are selected in the selector 4B, and they are outputted to the up counter 5B as input data of the up counter 5B.

In the up counter 5B, the increment operation of the up counter 5B is controlled depending on the state of signals ("H" or "L") of the address load signal e and the clock enable signal f which are respectively inputted thereto from the address generating control circuit, so that the start addresses XA and YA which are respectively inputted thereto from the selector 4B as input data are outputted to the failure analysis memory connected to the output stage as the address data I, and also outputted to the comparator 1B. Accordingly, in the address compression blocks shown in FIG. 2, addresses for transferring data from the address compression memory to the CPU (not shown) by the start addresses XA and YA which are inputted thereto from the up counter 5B are moved from the position (5) to the position (6).

Further, in the position (6) of FIG. 2, since the X address compression rate a which is set by the external address generating control circuit is inputted thereto and selected by the selector 7B of the X address generating circuit 100 as the address compression rate signal 2h, the X address compression rate a is inputted from the selector 7B and the down counter 9B as the input data. That is, the start address XA in FIG. 2 is loaded into the up counter 5B of FIG. 1 at the position (6) of FIG. 2, and the X address compression rate a of FIG. 2 is loaded into the down counter 9B.

Still further, since the Y address compression rate b which is set by the address generating control circuit is inputted thereto and selected by the selector 7B of the Y address generating circuit 100 as the address compression rate signal 2h, the Y address compression rate b is inputted from the selector 7B and the down counter 9B as input data. That is, the start address YA in FIG. 2 is loaded into the up counter 5B of FIG. 1 at the position (6) in FIG. 2, and the Y address compression rate b of FIG. 2 is loaded into the down counter 9B of FIG. 1.

Subsequently, when the address generating operations of the address generating circuit are repetitively executed, the X address is incremented by the X address compression rate a from the position (6) shown in FIG. 2 while the Y address is incremented by the Y address compression rate b, so that addresses are specified at the X address compression rates a and b in the direction of the arrows in the address compression blocks for partitioning the failure analysis memory shown in FIG. 2 so that the address data specified at the address compression rate are sequentially transferred to the CPU.

In the comparator 1B, the end address data a which is inputted from the external system control circuit (not shown ) to the input terminal A thereof is compared with the address data I which is inputted from the up counter 5B to the input terminal B by the comparator 1B. If the address data I is greater than the end address data a, the address end signal k is outputted to the address generating control circuit connected to the output stage, thereby terminating the address generating operation.

As mentioned in detail above, even if the start address is set at an arbitrary address but not at the leading address in the address compression blocks for partitioning the failure analysis memory of FIG. 2, the X address compression rate a' is calculated to be located in the address compression blocks from the relation between the arbitrary start address and the X address compression rate a, then an increment operation of the X address is executed based on the X address compression rate a', so that the increment operation of the address which starts from the arbitrary start address is executed in accordance with the address compression blocks, so that the operation to compress and specify the address in the failure analysis memory can be normally executed in the address generating circuit 100 of the invention.

Accordingly, data analysis can be executed from an arbitrary address when executing failure analysis of a memory device having large capacity, thereby reducing a load applied to the application software for executing the failure analysis.

Still further, the address generating circuit 100 of the invention includes the selector 4B, which is provided at the input stage of the up counter 5B for generating increment addresses, for alternatively selecting the data selected by the selector 2B or the data held by the flip flop 3B in response to the address load enable signal d, and loading the selected data into the up counter 5B. At the start of address generation, the start address data b is held in the flip flop 3B and at the same time loaded into the up counter 5B as the output of the selector 4B, thereby rendering the address generating circuit to form a circuit capable of controlling the operation timing for generating increment addresses by a single clock, and reducing a load applied to the circuit.

According to the address generating circuit for data compression of the first aspect of the invention, the data analysis can be executed from an arbitrary address to reduce a load applied to the application software for executing a failure analysis when executing a failure analysis of a memory device having a large capacity.

According to the address generating circuit for data compression of the second aspect of the invention, the address compression rate which is selected by the address compression rate selector can be calculated from the start address which is arbitrarily set and the address compression rate which is set in advance, thereby easily calculating the address compression rate.

According to the address generating circuit for data compression of the third aspect of the invention, the load data selector is further provided at the input stage of the up counter for generating increment addresses so that the data selected by the selector and the data held by the register are alternatively selected in response to a given synchronous signal to load the selected data into the up counter, thereby rendering the address generating circuit to form a circuit capable of controlling the operation timing for generating the increment addresses by a single clock, and reducing the load applied to the circuit.

What is claimed is:

1. An address generating circuit for data compression comprising:

an adder for executing addition between address compression rate signal and a load data, a selector for alternatively selecting an addition data outputted from the adder and a start address data, a register for holding the data selected by the selector, an up counter for generating an increment addresses while the data held by the register serves as a load data, a down counter for generating an address carry signal while the address compression rate signal serves as the load data, a comparator for comparing an end address with the addresses outputted from the up counter to detect a final address, wherein addresses in a memory are compressed to generate address data so as to transfer all data stored in the memory at an arbitrary compression rate, said address generating circuit further comprising:

an address compression rate selector for selecting an arbitrary address compression rate;

wherein the address compression rate is selected by the address compression rate selector to set the start address to an optimum value, thereby starting the compression and transfer data from an arbitrary address in the memory.

2. The address generating circuit for data compression according to claim 1, wherein the address compression rate selected by the address compression selector is calculated from the start address which is arbitrarily set and the address compression rate which is previously set.

3. The address generating circuit for data compression according to claim 1, further comprising a load selector provided at an input stage of the up counter for generating the increment addresses for alternatively selecting the data selected by the selector and the data held by the register in response to a given synchronous signal to load the selected data into the up counter.

* * * * *